United States Patent

[11] 3,582,658

[72] Inventor Yoh Mita
Tokyo, Japan
[21] Appl. No. 841,904
[22] Filed July 15, 1969
[45] Patented June 1, 1971
[73] Assignee Nippon Electric Company, Limited
Tokyo, Japan

[54] LIGHT SCANNING DEVICE UTILIZING PIEZOELECTRIC SEMICONDUCTOR MATERIAL

3 Claims, 2 Drawing Figs.

[52] U.S. Cl. .................... 250/211, 250/214, 310/8, 333/72, 338/15
[51] Int. Cl. .................... H01j 39/14
[50] Field of Search .................... 250/210, 214, 211 J, 211; 338/15; 333/72; 310/8.1, 8.2, 8.3

[56] References Cited

UNITED STATES PATENTS

| | | | |
|---|---|---|---|
| 2,428,806 | 10/1947 | Liben et al. | 250/210X |
| 3,202,824 | 8/1965 | Yando | 250/211 |
| 3,446,975 | 5/1969 | Adler et al. | 250/211 |

*Primary Examiner*—James W. Lawrence
*Assistant Examiner*—C. M. Leedom
*Attorney*—Sandoe, Hopgood and Calimafde

ABSTRACT: A solid-state light scanning device includes two rodlike crystal of piezoelectric semiconductor material disposed substantially parallel and offset with respect to one another, each provided with electrodes at the opposite ends, and a photoconductor sandwiched between the two crystals to form an integrated unit. Means are also provided to initiate electric fields in said crystals with a predetermined time difference.

INVENTOR.
Yoh Mita by Sandoe, Hopgood & Calimafde
ATTORNEYS

LIGHT SCANNING DEVICE UTILIZING PIEZOELECTRIC SEMICONDUCTOR MATERIAL

BACKGROUND OF INVENTION

Many attempts have been made to reduce to practice a light scanning device using a piezoelectric semiconductor material such as cadmium sulfide in order to gain the advantages of unique construction and excellent time response characteristics; features which are not possessed by similar conventional devices. Light scanning devices of this type thus far proposed include means for connecting a CdS photoconductor to a semiconductive CdS rodlike crystal causing a current to be partially bypassed by the former when a high electric field domain moves in the latter, thereby enabling a one-dimensional variations in a light signal to be converted into a current signal varying with time. Since the method which has been conventionally employed utilizes means for short-circuiting opposite sides of a domain in a CdS rodlike crystal with a photoconductor, it is generally difficult to enhance the resolution (see for example Clementson, Proc. IEEE(1967) page 2168). Another defect is that the sensitivity must be sacrificed or the connection to a photoconductor is markedly complex in order to improve the resolution.

Furthermore with conventional light scanning devices there arises the necessity of affixing metallic electrodes or providing a copper diffusion layer on the surface, for connection to the photoconductor. This results, in most cases, in the heterogeneity of the CdS rodlike crystal and hence, in the occurrence of severe noise in the output current signal.

OBJECT OF INVENTION

Accordingly, it is the object of this invention to eliminate the aforementioned defects in the conventional light scanning devices and to realize high resolution with a simple structure.

SUMMARY OF INVENTION

The present invention is predicated upon two rodlike crystals of piezoelectric semiconductor material, sandwiching a photoconductor therebetween to form an integrated unit, and upon the provision of a predetermined time difference in the high electric field domains which will occur in the two crystals.

The above mentioned and other features and objects of this invention and the manner of attaining them will become more apparent and the invention itself will best be understood by reference to the following description of embodiments of the invention taken in conjunction with the accompanying drawings, the description of which follows.

DETAILED DESCRIPTION OF INVENTION

Figure 1:
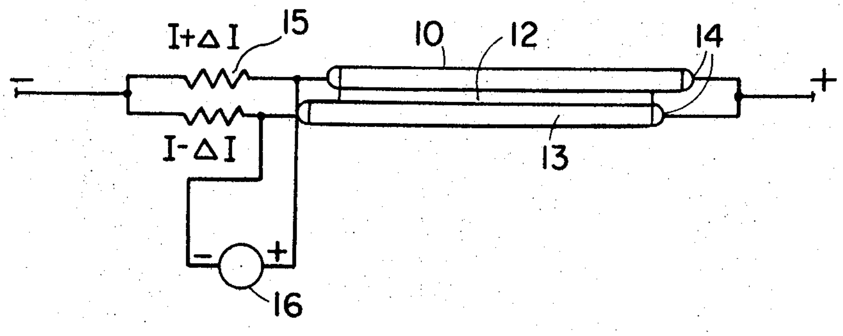
FIG. 1 is a schematic representation of a light scanning device according to an embodiment of this invention.
Figure 2:
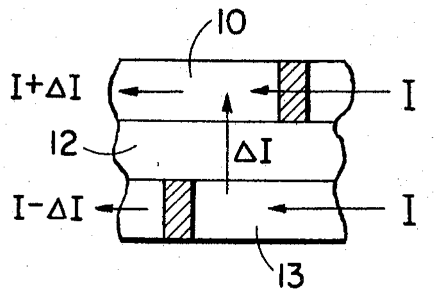
FIG. 2 is an enlarged detail view of a part of the device shown in FIG. 1.

As shown in FIG. 1, two similar CdS semiconductor pieces or crystals 10 and 13 are disposed parallel but laterally offset with respect to one another so as to produce prescribed extensions on both sides and a CdS photoconductor 12 is sandwiched between the overlapped or coextensive portions of the two semiconductors to form an integrated unit.

Typical dimensions of semiconductor pieces 10 and 13 and photoconductor 12 are of the order of 1×1×10 mm. (with photoconductor 12 slightly smaller) and the resistivities of semiconductor pieces 10 and 13 are of the order of 10Ω-cm., whereas the dark and light resistivities of the photoconductor 12 are of the order of $10^5$Ω-cm. and $5.10^2$Ω-cm., respectively. The amount of extension is determined by the resolution requirement and is of the order of 1 mm., for example. If now the single crystals 10 and 13 are connected in shunt through the electrodes 14 and the series resistances 15, and a pulse voltage of the order of 1 kv. is applied across the opposite electrodes as indicated by the +— signs in FIG. 1, two high electric field domains occur in the crystals in the vicinity of the cathode connected with the series resistances 15 and move toward the right with approximately the acoustic velocity. The described shunt connection will permit the domains to occur almost simultaneously in the crystals 10 and 13. When the CdS photoconductor 12 is partially irradiated with light, a current ΔI which is proportional to the photoconductivity flows from the crystal 13 to the crystal 10 in the time interval during which the irradiated portion is interposed between the domains in the crystals 10 and 13. Current conduction is thus increased in crystal 10 and is decreased in crystal 13. By applying the output voltages of these crystals to a differential amplifier 16, the spatial light distribution can be known by reading the difference between the voltages produced across the series resistances connected in series with the crystals 10 and 13.

Typical numerical values are as follows: The current values per semiconductor under the condition of domain formation are of the order of 1.2A and 0.6A, respectively; while Δ I is of the order of 0.08A, provided the contact resistance is small. In cases where the photoconductivity is exceedingly large or the amount of extension beyond the overlapped region on both sides on the CdS semiconductors is appreciably large, the magnitude of Δ I can scarcely be neglected and the domain voltages are caused to change or at times, to disappear. On the contrary, if the amount of the extension is designed sufficiently small, the output current becomes small, although the resolution becomes high.

One method of connecting the CdS semiconductors and the CdS photoconductor is to attach on both surfaces of the CdS photoconductor, a number of indium film pieces of strip form parallel to one another and orthogonal to the direction of the electric field and to attach the CdS semiconductors to both surfaces of the CdS photoconductor by thermocompression.

While the present embodiment has described the employment of a CdS single crystal as a photoconductor, it may be preferable in order to increase the resolution and sensitivity, to integrate a CdS evaporated layer in between the rodlike CdS semiconductors and then, to provide slots in the layer in a direction perpendicular to the electric field direction. In order to improve the time constant, the use of a highly resistive semiconductor having a short carrier life such as a single crystal of gallium arsenide is recommended in lieu of CdS. Further the semiconductor crystals may be totally coextensive or overlapped and two separate pulses shifted in time may be applied across the opposite electrodes of these crystals for the equivalent performance. Moreover, an extremely thin dielectric bonding agent may be substituted for metallic indium for the equivalent effect, the two crystals being coupled together through a thin barrier.

While the principles of the invention have been described in connection with specific apparatus, it is to be clearly understood that this description is made only by way of example and not as a limitation to the scope of the invention as set forth in the objects thereof and in the accompanying claims.

What I claim is:

1. A solid-state light scanning device comprising two rodlike crystals of piezoelectric semiconductor material arranged in a laterally offset relationship with respect to one another and disposed substantially parallel to each other, each of said crystals being provided with electrodes at the opposite ends thereof, a photoconductor sandwiched between said two rodlike crystals to form an integrated unit therewith; and means for providing electric fields in said crystals with a predetermined time difference.

2. The solid-state light scanning device claimed in claim 1 wherein the electrodes at one end of said crystals are coupled in common and the electrodes at the other end are coupled to one another through resistance means.

3. The solid-state light scanning device of claim 2, further comprising a differential amplifier having two inputs respectively coupled to the resistance coupled electrodes.